United States Patent [19]

Wake et al.

[11] Patent Number: 4,876,166

[45] Date of Patent: Oct. 24, 1989

[54] COLOR FILTER ARRAY

[75] Inventors: Ronald W. Wake, Hilton; Sibylle L. Reithel, Ontario; Hugh G. McGuckin, Rochester, all of N.Y.

[73] Assignee: Eastman Kodak Company, Rochester, N.Y.

[21] Appl. No.: 195,917

[22] Filed: May 19, 1988

[51] Int. Cl.$^4$ .......................... G03C 1/71; G03C 7/10
[52] U.S. Cl. .......................................... 430/7; 430/941
[58] Field of Search ...................................... 430/7, 941

[56] References Cited

U.S. PATENT DOCUMENTS

| | | | |
|---|---|---|---|
| 3,929,489 | 12/1975 | Arcesi et al. | 430/278 |
| 4,315,978 | 2/1982 | Hartman | 430/4 |
| 4,355,087 | 10/1982 | Martin | 430/7 |
| 4,357,415 | 11/1982 | Hartman | 430/293 |
| 4,374,194 | 2/1983 | McGuckin et al. | 430/199 |
| 4,383,018 | 5/1983 | Martin et al. | 430/14 |
| 4,416,961 | 11/1983 | Drexhage | 430/7 |
| 4,580,159 | 4/1986 | Manabe | 358/44 |
| 4,764,670 | 8/1988 | Pace et al. | 250/226 |

FOREIGN PATENT DOCUMENTS 249991 12/1987 European Pat. Off. .

*Primary Examiner*—Paul R. Michl
*Assistant Examiner*—Mark R. Buscher
*Attorney, Agent, or Firm*—Raymond L. Owens

[57] ABSTRACT

A color filter array suitable for use in an image sensor is formed with a first layer having a mordant of one polarity and a first dye of the opposite polarity, and a second layer having a second mordant of a polarity opposite to the first mordant and a second dye of a polarity opposite to the second mordant.

4 Claims, 2 Drawing Sheets

COLOR FILTER ARRAY

FIELD OF INVENTION

The present invention relates to color filter arrays.

BACKGROUND ART

Image sensors are provided with sensing elements which provide a potential well or depletion region in a substrate. Color filter arrays having patterns of color are selectively formed over the sensing elements. Light passes through these colored patterns and causes charge to be collected in the potential wells.

Color filter arrays are generally classified into two types, i.e., primary color type array employing red, green, and blue (RGB), and complementary color type filter array employing white, yellow, and cyan (WYC), or white, yellow, cyan, and green (WYCG), or the like. In the WYCG of like part-primary, part-complementary color filter array, good color reproduction is unattainable unless the spectral characteristics of the primary color coincides with one which is to be set up when those of two complementary colors are superimposed.

Color filter arrays are presently fabricated on top of photoelectronic sensors by patterning a diazo resin or other suitable binder containing a cationic mordant. The pattern is then subjected to a solution of an anionic dye. This results in dye incorporation into the pattern due to the binding of the anionic dye to the cationic mordant site. The full color filter array requires multiple layers of these dyed patterns so overcoating is necessary. Since the same type of resin is used for each layer, all dyes also have to be anionic in nature. This has caused problems in some instances where a dye is not bound tightly enough to the mordant. During the overcoating of the next layer of resin some of the dye is leached out causing less than optimum dye density and non-uniform dye density across the pattern. When this next layer is patterned there are always some areas of the underlying dyed pattern left exposed. This results in unwanted cross-dyeing caused by the uptake of the second dye in these uncovered areas.

This problem can be circumvented by intermediate treatment of the dyed pattern before coating the next layer. This treatment is meant to act as a barrier to dye leaching thus preventing cross-dyeing. However, this treatment involves at least one additional coating step to apply the material and often further treatment is necessary before the second resin layer can be applied. Examples of such barrier treatments are disclosed in U.S. Pat. Nos. 4,315,978; 4,355,087; and 4,357,415.

A method for eliminating the cross-dyeing problem was described in U.S. Pat. No. 4,580,159. It also involved the use of alternating layers of dye binders differing in their dyeing properties. This case differs from the present invention in that one was hydrophilic and the other hydrophobic. The hydrophilic layers were dyed by immersing in solutions of acid dyes and disperse dyes were heat transferred into the hydrophobic binders.

Although this method should indeed prevent cross-dyeing, it also involves the use of organic solvents for the coating of the hydrophobic layers. This is undesirable since organic solvents cause environmental safety and disposal problems that would not be encountered with an all hydrophilic system. Also, the dye density and uniformity produced by a heat transfer method of dyeing are not as controllable as with solution dyeing of hydrophilic layers to saturation.

SUMMARY OF THE INVENTION

The object of this invention is to provide an improved color filter array which eliminates the above-described cross-dyeing problem.

This invention uses mordant/dye systems of opposite polarity in adjacent layers when there is weakly bound dye in the underlying layer. If there is a cationic mordant and an anionic dye in the lower layer then the next layer should be constructed by absorbing a cationic dye in an anionic mordant. The anionic mordant would not abstract anionic dye from the underlying layer during the coating process. Also, any areas of the underlying layer unprotected during the dyeing of the subsequent layer would not absorb the unwanted dye because of its incompatible polarity. The result is a simplified process requiring fewer steps.

The object is achieved by a color filter array for an image sensor, comprising:

a first layer having a first mordant of a first polarity and a color dye of a second, opposite polarity, and a second layer having a second mordant of a second polarity, opposite the first mordant, and a color dye of the first polarity.

It will be appreciated that the drawings are not to scale for ease of exposition.

DESCRIPTION OF THE PREFERRED EMBODIMENT

The present invention is especially useful in the fabrication of color filter arrays over electronic image sensors, however it is also useful in any application requiring the formation of multiple layers of patterned colors.

Figure 1A:
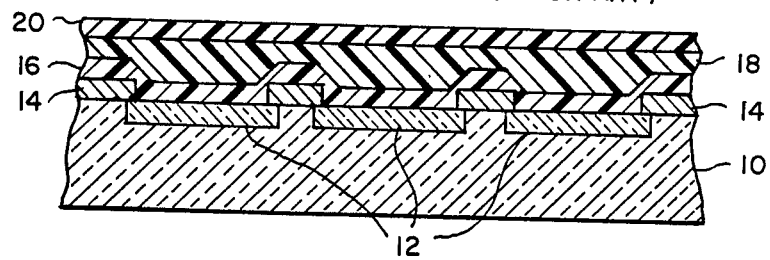
FIGS. 1 (a-d) show the various steps involved in making a color filter array by the prior art.
Figure 1B:
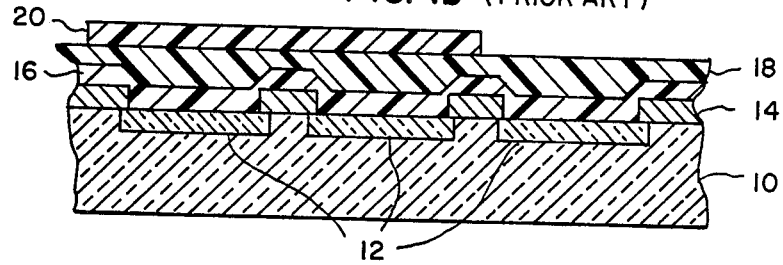

FIG. 1a shows an electronic image sensor formed in a substrate 10, typically silicon. This sensor basically consists of photoactive areas 12 separated by light shielding areas 14, typically formed of aluminum. The entire sensor is covered with an insulative layer 16, typically silicon dioxide. At this point, the sensor is only capable of sensing light and dark areas since the photoactive areas have no color discrimination capability. Color sensing capability is gained by first coating the sensor with a material 18, to make the sensor surface more planar. This material can be anything capable of being hardened sufficiently to prevent intermixing with subsequent resin layers and be impermeable to the dyes used. Examples of such materials could be those same materials used as barrier layers in the prior art or the same resin used in the overlying color layers.

When the sensor surface is sufficiently planar to allow fine definition patterning the first photoactive mordant layer 20 is applied. Application can be by any method resulting in the necessary thickness and uniformity. The preferred method for application to electronic image sensors is by spin coating. This involves applying a solution of the photoactive mordant material to the surface of the sensor and spinning the sensor at the desired speed. The photoactive mordant composition can be any patternable cationic mordant composition. Most commonly, these are diazo resin/cationic mordant combinations. Useful examples of these are described in U.S. Pat. Nos. 4,220,700 and 4,247,615. Any water-soluble, light-sensitive diazo resin can be used. Particularly useful examples are low molecular weight resins having a recurring unit of the formula:

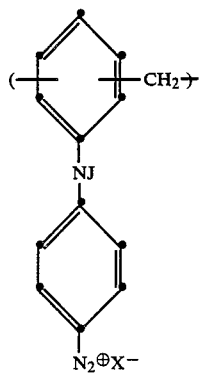

wherein J is $J^1$ or $J^2$ defined below, and $X^\ominus$ is an anion such as chloride or the like. Conventionally, these are produced by the condensation of active carbonyl compounds, such as formaldehyde or paraformaldehyde, with a diazo compound of the general formula:

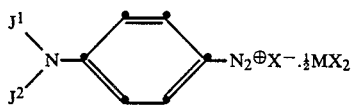

wherein:

$X'$ is halide such as chloride;

M is a di- or trivalent metal of the group known to stabilize diazonium groups, e.g. cadmium, zinc, bismuth, arsenic, antimony, tin, iron, platinum, mercury;

$X^\ominus$ is an anion or mixture of anions such as halides or surfates; and $J^2$ may be a phenyl or substituted phenyl in which case the resin is an aldehyde condensation product of a p-diazodiphenylamine salt, and $J^1$ is hydrogen, $J^2$ and $J^1$ may also be organic radicals functionally capable of entering into an addition polymerization, polyesterification, condensation, or other reaction capable of producing a resin. $J^1$ and $J^2$ in this case may be the same or different, the diazonium compound being a substituted p-diazo-aniline.

Highly preferred resins are acid condensation products of a diazonium salt of p-aminodiphenylamino, such as diphenylamine-4-diazonium halide or diphenylamine-4-diazonium phosphate, condensed in acid with aldehydes such as paraformaldehyde or formaldehyde, and converted to a double metal salt, such as chlorozincate or fluoroborate. Such resins are conventional, the preparations and further details of which are described for example, by Kosar, *Light Sensitive Systems*, pages 323–324 (1965), and by U.S. Pat. No. 3,235,384. One particularly suitable diazo resin composition is the composition described in *Research Disclosure*, Volume 169, Item 16976, May 1978, entitled "Continuous-Tone Dyed Diazo Imaging Elements."

For the diazo resin, the water solubility imparted by the diazo groups is eliminated by UV exposure, so the insolubilization mechanism seems to be one of precipitation and not crosslinking.

To provide increased shelf life to the coating, it is conventional to add an acid preservative to the diazo resins described above. Conventional acids so used include phosphoric acid, citric acid, p-toluenesulfonic acid, methanesulfonic acid, benzenesulfonic acid and substituted derivatives thereof, 2-naphthalenesulfonic acid, and the like. Alternatively, if immediate use is contemplated, such acid stabilizers can be omitted. If an acid stabilizer is used, the amount can vary from between about 0.1 mg./dm.$^2$ (1.0 mg./ft.$^2$) and about 1.0 mg./dm.$^2$ (10.0 mg./ft.$^2$).

Cationic mordants admixed with the resin serve to mordant anionic dyes when an element formed from the imagewise-photohardened composition is dipped into an appropriate dye solution. Not all cationic mordants are capable of functioning effectively with the diazo resin. For example, some mordants are incompatible with the resin because they precipitate the resin out of the solution, preventing the composition from being coated. Still others substantially eliminate the normal adhesion that the photohardened diazo resin has to the support, or they prevent photohardening of the resin. Thus, the mordant must be a compatible mordant and, as used herein, a "compatible mordant" is one that does not interfere with the normal photohardening capability of the diazo resin, whether it be interference with the solution properties necessary for coating, the adhesion properties of the photohardened resin, the photohardening process itself, or any other property of the resin relating to photohardening.

The mechanism of the interaction between compatible mordants and the diazo resin is not completely understood; that is, it is not clear whether photocross-linking occurs only within the diazo resin, entrapping the mordant therein, or whether the mordant, if polymeric in form, cross-links with the resin. In any case, the mordant must be one which, by whatever mechanism, is capable of being retained in the photohardened form of the composition, in addition to being compatible as hereinbefore defined.

Useful polymeric mordants include some of those which have previously been used in various photographic films, papers and other applications and which have a composition which contains repeating monomeric units containing charge-bearing cationic groups. Of course, it should be recognized that other polymeric materials having the above-described properties and chemical composition, but which have not heretofore been identified as useful photographic mordants in the photographic arts, can also be employed within the scope of the present invention.

Particularly useful polymeric mordant compositions which can be employed in the invention are vinylbenzyl quaternary ammonium polymeric mordants which comprise a repeating unit which conforms to the structure:

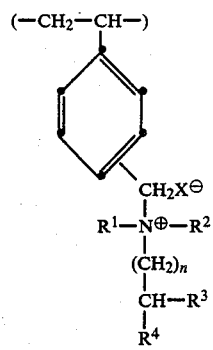

wherein:

R¹ and R² are the same or different and are aryl, aralkyl, or alkaryl having from 6 to about 20 carbon atoms or an alkyl group having from 1 to about 10 carbon atoms;

n is 0, 1, or 2;

R³ and R⁴ are either both hydrogen or, together with the carbon atom to which they are attached, form a saturated, unsaturated, or aromatic ring or ring system containing from 5 to 10 carbon atoms such as cyclohexyl, cyclopentyl, phenyl, and naphthyl; and X⊖ is an anion, such as halide, e.g. chloride; methosulfate; or p-toluenesulfonate.

Where the mordant is a copolymer, the remainder of the polymeric mordant is not critical. Many ethylenically unsaturated monomers can be copolymerized with the vinylbenzene quaternary ammonium monomers to produce satisfactory mordants. Vinylene benzenes, e.g. styrene, are preferred ethylenically unsaturated monomers for incorporation in the mordant copolymers. The quaternary ammonium containing repeating units usually comprise between 10 and 100, preferably 40 to 100 mole percent of the polymeric mordant.

Exemplary preferred cationic mordants are listed in U.S. Pat. No. 4,220,700 and commonly assigned U.S. patent application Ser. No. 876,510 filed June 20, 1986, entitled "Color Filter Arrays," the disclosures of which are incorporated by reference herein.

The relative amounts of mordant and diazo resin depend on the molecular weight and the mordanting strength of the mordant, the particular dyes to be used to make the color filter elements of the color filter array, and other factors. A preferred range of diazo resin is from about 0.16 to about 1.0 mg./dm.² of coating, and a preferred range of mordant is from about 0.5 to about 5.0 mg./dm.², most preferably from about 1.0 to 1.5 mg./dm.².

After coating; the solvent, typically water, is removed by drying the layer either at ambient or elevated temperatures. The resulting solid layer is then exposed imagewise to actinic radiation, typically ultraviolet radiation, to define the desired pattern. After exposure, the layer is brought into contact with a developer, typically water, which selectively washes off the layer in unexposed areas. The support bearing the layer is typically immersed in the developer or spun while being sprayed with the developer to insure uniform developer contact.

After the patterned filter layer is formed, it is preferably dyed with a single subtractive primary dye containing an anionic charge group. This can be achieved by bringing the dye in solution into contact with the filter layer and imbibing the dye into the filter layer. While in principle any dye with an anionic charge should be imbibed into the patterned cationic mordant layer, subtractive primary dyes (cyan, magenta, and yellow) are preferred as is taught in the above cited U.S. patent application Ser. No. 876,510 filed June 20, 1986, entitled "Color Filter Arrays." The exemplary preferred yellow, magenta, and cyan dyes are listed in said filing.

Figure 1C:
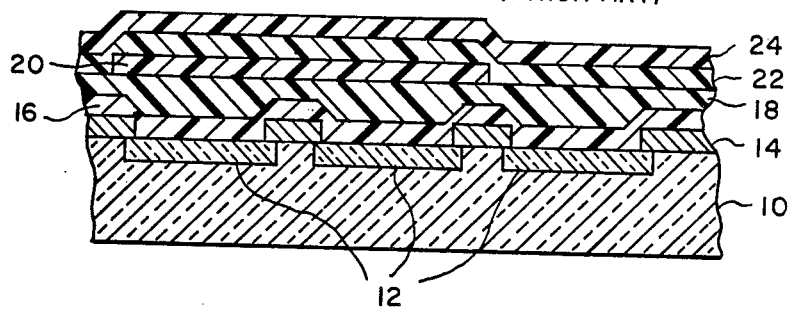
Figure 1D:
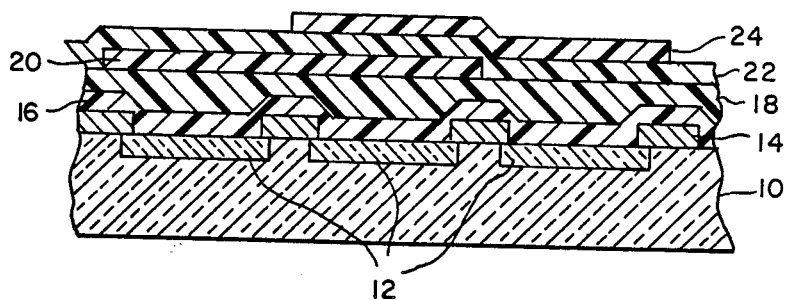
Figure 2A:
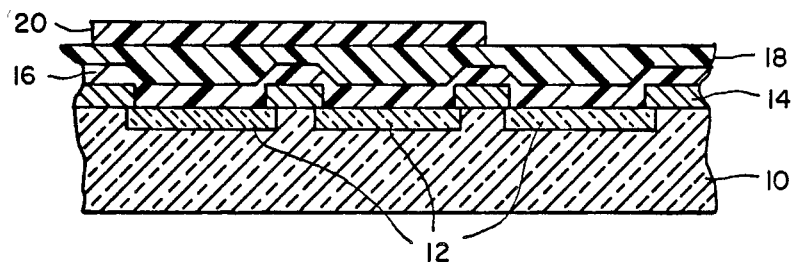
FIGS. 2 (a-c) shows the various steps involved in making a color filter array in accordance with the invention.
Figure 2B:
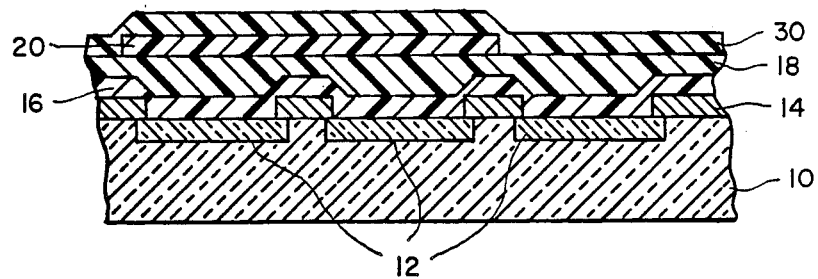

The patterned and dyed filter layer is shown as element 20 in FIG. 2a. At this point in the fabrication of the color filter array, the prior art would require the coating of a barrier layer 22 in FIG. 1c, to prevent any change in element 20 due to subsequent overcoating. However, the present invention allows the direct coating of the next photopatternable mordant layer 30 in FIG. 2b. This photopatternable mordant layer can be any material capable of being coated with the desired thickness and uniformity, photopatternable, and able to strongly mordant cationic image dyes. Preferably all processing of the layer; coating, imaging, and dyeing; should be accomplished with non-toxic, hydrophilic solvents. A useful class of photohardenable photopolymers are photosensitive polyesterionomers represented by the formula:

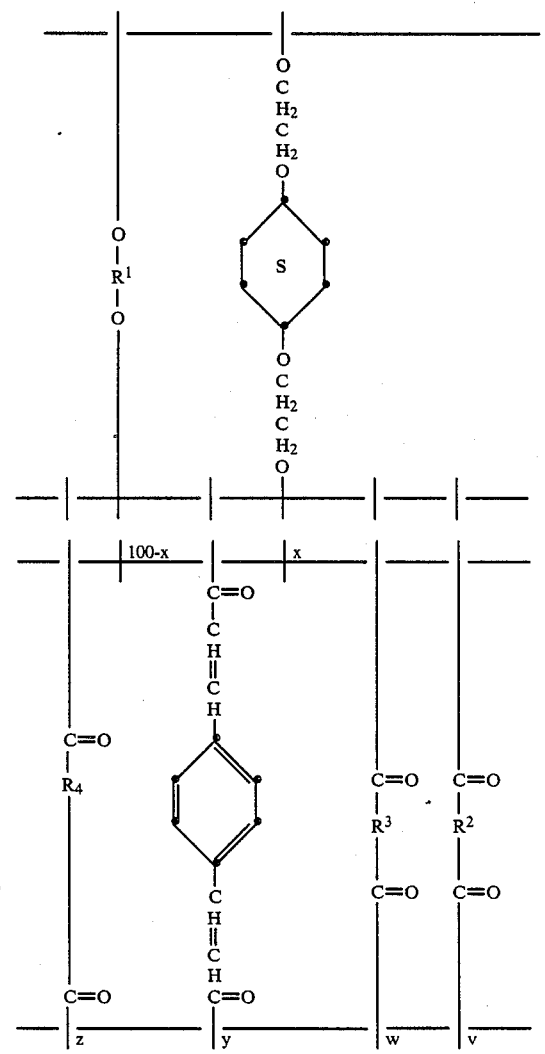

wherein:

$R^1$ is straight or branched chain alkylene containing 2 to 10 carbon atoms, such as ethylene, propylene, butylene, trimethylene, 2,2-dimethyl-1,3-propylene, or 1,10-decylene; a cycloalkylene group containing 5 or 6 carbon atoms, such as 1,4-cyclohexylene or 1,4-cyclohexylenedimethylene; or an aliphatic ether group containing 3 to 12 carbon atoms in the aliphatic ether chain, such as oxydiethylene and ethylenebis(oxyethylene);

$R^2$ is an aromatic group containing 6 to 12 carbon atoms, such as phenylene or naphthylene; $R^3$ is straight or branched chain alkylene containing 2 to 10 carbon atoms, such as ethylene, propylene, butylene, 2,2-dimethyl-1,3-propylene, and 1,10-decylene;

$R^4$ is an ionic group selected from those having the structures:

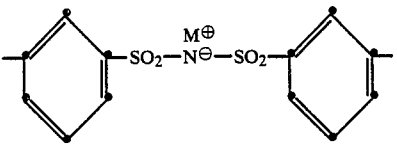

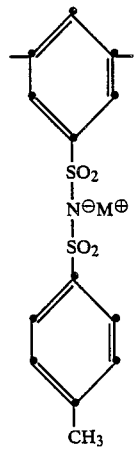

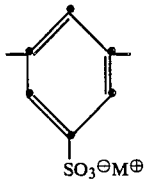

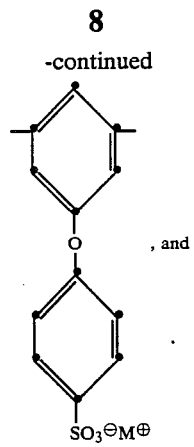

, and

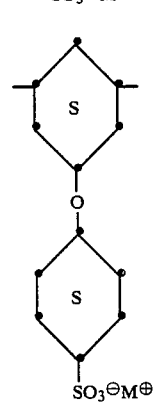

wherein:

$M^\oplus$ is an alkali metal or ammonium ion;
x is 50 to 100 mole percent;
v is 0 to 35 mole percent;
w is 0 to 35 mole percent;
y is 50 to 85 mole percent; and
x is 15 to 40 mole percent.

The photosensitive polyesterionomers are prepared by processes known in the polymer synthesis art. Examples of the preparation of useful photosensitive polyesterionomers are described in, for instance, U.S. Pat. No. 3,929,489 and U.K. Specification No. 1,470,059, the disclosures of which are expressly incorporated herein by reference.

A particularly useful photosensitive polyesterionomer is poly[1,4-cyclohexylenebis(oxyethylene)p-phenylenediacrylate-co-3,3'-sodioiminodisulfonylbis(-benzoate)] represented by the formula:

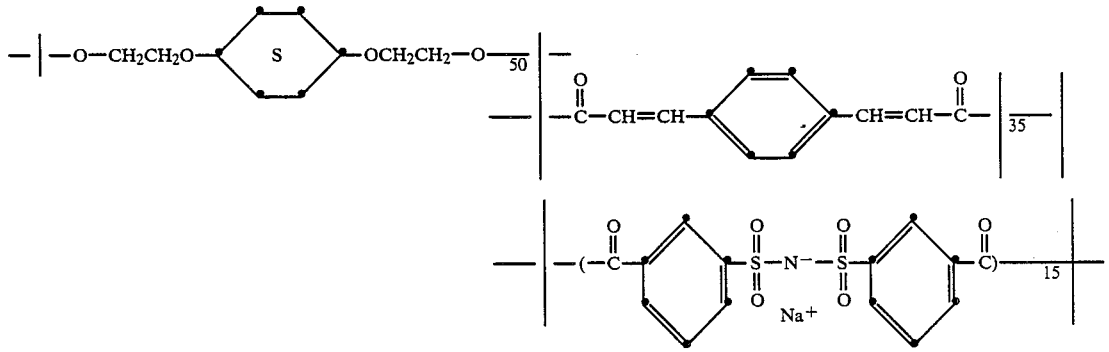

The activating radiation for exposure of the polyesterionomer layer is generally primarily ultraviolet radiation. Increased sensitivity or expansion of response to other wavelengths of light can be accomplished by addition of a suitable sensitizer.

Following imagewise exposure, development of the element is achieved generally by merely water rinsing the element. The term "water" herein means distilled water and conventional drinking water. The term also includes aqueous solutions containing components, such as metal ions. Alternatively, development is achieved by a mixture of water and a suitable organic solvent, such as ethanol.

Various water-soluble cationic dyes could be utilized to color the photopolymer images. However, only dyes having the correct color characteristics and light stability when mordanted are applicable. Examples of useful dyes are listed in Table 1 below:

TABLE 1

| Color | Structure |
|---|---|
| magenta | 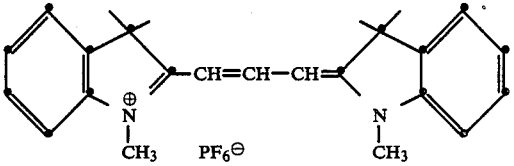 |
| magenta | 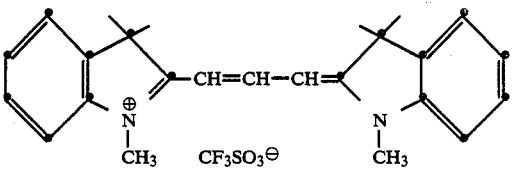 |
| magenta | 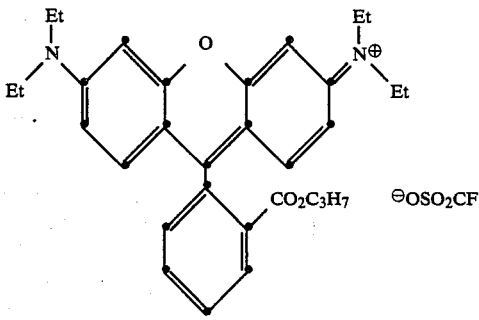 |
| yellow | 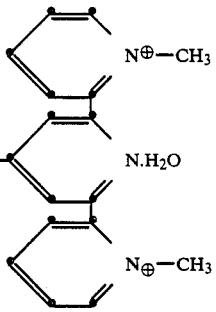 |
| yellow | 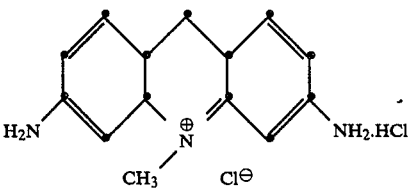 |
| yellow | 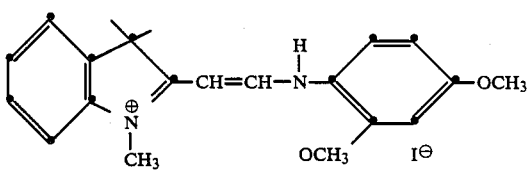 |

TABLE 1-continued

| Color | Structure |
|---|---|
| yellow | (structure: methylated indolinium with CH=CH-NH linkage to dimethoxyphenyl, pTs⁻ counterion) |
| yellow | (structure: methylated indolinium with CH=CH-NH linkage to dimethoxyphenyl, pTs⁻ counterion) |

Figure 2C:
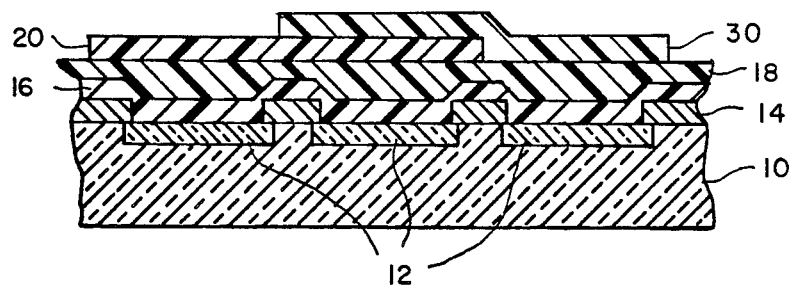

This results in a three-color array as shown in FIG. 2c. The three different photoactive areas, 12 would see three different colors of light. For example, if 20 is dyed with a cyan dye and 30 with yellow then the area where 20 and 30 overlap would sense only green light.

This invention is not limited to those color filter arrays containing only two layers. A third layer with polarity like that in 20 can be applied over the structure shown in FIG. 2c. Since this third layer is of like polarity to that of 20 and there will be areas where it will be in contact with 20, judicious choice of the overall ordering of the layers is advisable. The preferred manner in which to practice this invention is to make the first patterned layer 20, be that in which the dye is most strongly mordanted. Thus, when this first layer is saturated with the desired dye, interference from subsequent layers of like polarity will be prevented.

The following example further illustrates the practice of this invention and in no way limits its scope.

EXAMPLE

A glass wafer, 75 mm. in diameter, treated to allow adhesion since it is not an actual substrate, was spin coated with 7 mL. of a diazo resin/mordant composition at 2000 rpm. This diazo resin/mordant composition was similar to those described in the above-referenced co-pending U.S. patent application Ser. No. 876,510 filed June 20, 1986.

It was exposed to 500 mJ./cm.$^2$ ultraviolet radiation through a chrome-on-glass mask describing the desired cyan pattern. The image was developed using running deionized water for 20 seconds and dyed with copper phthalocyanine tetrasulfonic acid, tetrasodium salt as is described in the above cited U.S. patent application Ser. No. 876,510 filed June 20, 1986, entitled "Color Filter Arrays."

A photosensitive polyesterionomer composition was prepared by first dissolving 20 gm. of poly[1,4-cyclohexylenebis(oxyethylene)p-phenylenediacrylate-co-3,3'-sodioiminodisulfonylbis(benzoate)] in 70 gm. of deionized water and adding 1 mL. of a 10% aqueous solution of Olin 10G. This mixture was stirred and heated to 55°-60° C. and to it added 20 mL. of a 1% solution of 2-[bis(2-furoyl)methylene]-1-ethyl-naphtho[1,2-D]thiazoline in acetone. As the acetone evaporated it was continually replaced with deionized water to maintain a final volume of 100 mL.

The resulting photosensitive polyester-ionomer solution was coated on the above glass wafer by dispensing sufficient volume to essentially cover the wafer and spinning the wafer at 2000 rpm. for 2 minutes. Patterning was accomplished by imagewise exposing this coating for 5 seconds using the full output of a 1000 W HgXe lamp and developing under running deionized water for 5 seconds. The resulting pattern was dyed by dispensing the dye solution onto the wafer in sufficient volume to cover it entirely, allowing it to set for 45 seconds, and then spinning off the excess. The dye solution was composed of:

| Component | Amount |
|---|---|
| See Table 1 | 0.2 gm. |
| Deionized water | 17 mL. |
| Ethanol | 17 mL. |
| Isopropyl alcohol | 66 mL. |

A third color layer was added by again coating the diazo/mordant photosensitive composition described above under like conditions. Imagewise exposure was also carried out in the same manner except the mask contained the desired pattern for yellow. After development, this pattern was dyed with the arylazopyrazolone dye of the structure, according to the above mentioned U.S. patent application Ser. No. 876,510 filed June 20, 1986.

The cross-dyeing problem was effectively eliminated by the structure produced by this example.

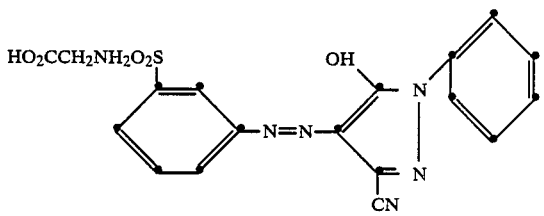

We claim:
1. A color filter array comprising:
   a first layer having a first mordant of a first polarity and a color dye of a second, opposite polarity, and
   a second layer having a second mordant of a second polarity and a color dye of the first polarity to thereby prevent cross-dyeing.
2. A color filter array comprising:
   a first layer having an cationic mordant and an anionic color dye; and a second layer having anionic mordant and a cationic dye to thereby prevent cross-dyeing.

3. The invention as set forth in claim 1 wherein the cationic mordant is:

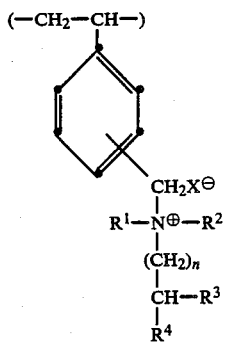

wherein:

R¹ and R² are the same or different and are aryl, aralkyl, or alkaryl having from 6 to about 20 carbon atoms or an alkyl group having from 1 to about 10 carbon atoms;

n is 0, 1, or 2;

R³ and R⁴ are either both hydrogen or, together with the carbon atom to which they are attached, form a saturated, unsaturated, or aromatic ring or ring system containing from 5 to 10 carbon atoms such as cyclohexyl, cyclopentyl, phenyl, and naphthyl;

X$^\ominus$ is an anion, such as halide; e.g. chloride, methosulfate, or p-toluenesulfonate and the anionic mordant is:

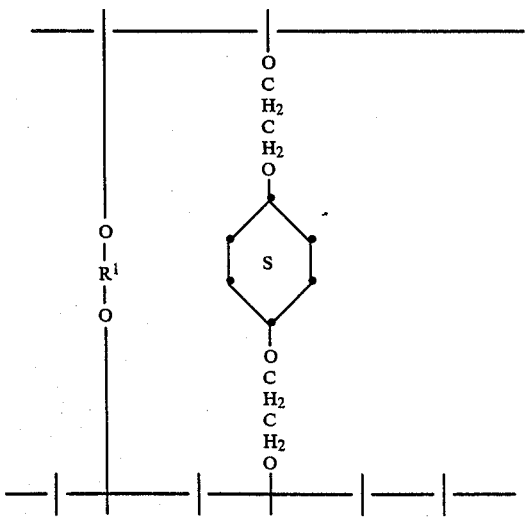

-continued

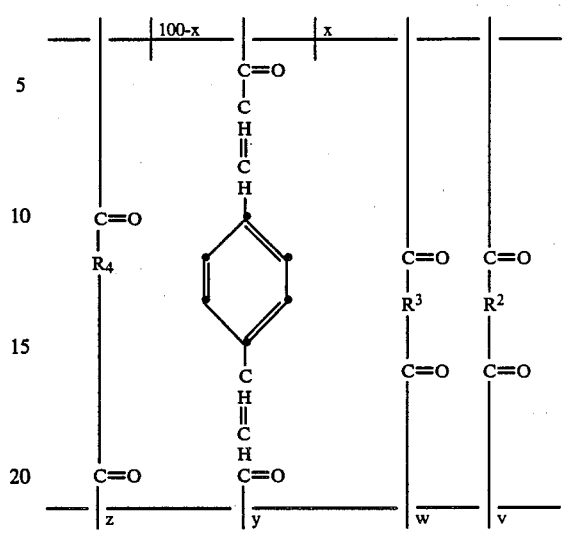

wherein:

R¹ is straight or branched chain alkylene containing 2 to 10 carbon atoms, such as ethylene, propylene, butylene, trimethylene, 2,2-dimethyl-1,3-propylene, or 1,10-decylene; a cycloalkylene group containing 5 or 6 carbon atoms, such as 1,4-cyclohexylene or 1,4-cyclohexylenedimethylene; or an aliphatic ether group containing 3 to 12 carbon atoms in the aliphatic ether chain, such as oxydiethylene and ethylenebis(oxyethylene);

R² is an aromatic group containing 6 to 12 carbon atoms, such as phenylene or naphthylene;

R³ is straight or branched chain alkylene containing 2 to 10 carbon atoms, such as ethylene, propylene, butylene, 2,2-dimethyl-1,3-propylene, and 1,10-decylene; and R⁴ is an anionic group selected from those having the structures:

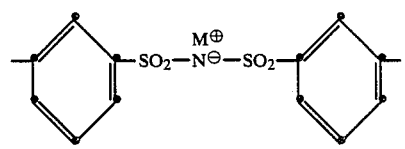

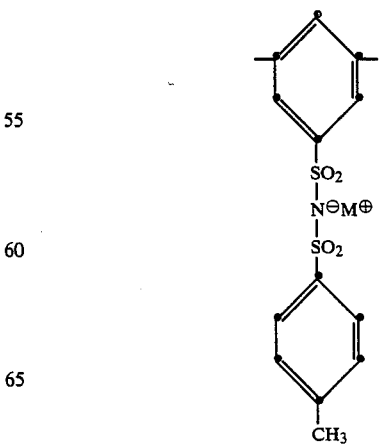

-continued

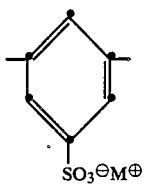

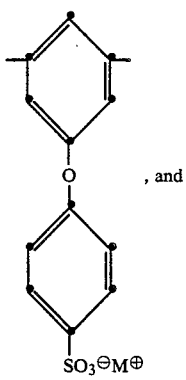, and

-continued

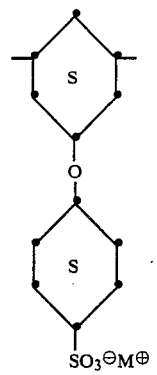

wherein:
M⊕ is an alkali metal or ammonium ion;
x is 50 to 100 mole percent;
v is 0 to 35 mole percent;
w is 0 to 35 mole percent;
y is 50 to 85 mole percent; and
z is 15 to 40 mole percent.

4. A method forming a color array on a substrate, comprising the steps of:
 (a) patterning a first layer of a first resin containing either an anionic polarity mordant or a cationic polarity mordant;
 (b) subjecting the first resin layer to a colored dye which is opposite in polarity from the resin;
 (c) patterning a second layer of a second resin which has a polarity opposite from the first layer; and
 (d) subjecting the second resin layer to a colored dye which has a polarity opposite to the second resin.

* * * * *